United States Patent

Miyakawa et al.

Patent Number: 5,920,508
Date of Patent: Jul. 6, 1999

[54] SEMICONDUCTOR MEMORY DEVICE

[75] Inventors: Tadashi Miyakawa; Hidetoshi Saito, both of Yokohama, Japan

[73] Assignee: Kabushiki Kaisha Toshiba, Kawasaki, Japan

[21] Appl. No.: 09/030,250

[22] Filed: Feb. 25, 1998

[30] Foreign Application Priority Data

Feb. 26, 1997 [JP] Japan ................................. 9-042241

[51] Int. Cl.$^6$ ........................................................ G11C 7/00
[52] U.S. Cl. ............................ 365/185.22; 365/185.19; 365/185.29
[58] Field of Search ........................ 365/185.22, 185.19, 365/185.29, 185.14, 185.24

[56] References Cited

U.S. PATENT DOCUMENTS 5,053,990  10/1991  Kreifels et al. ..................... 365/185.19
5,200,920   4/1993  Norman et al. ..................... 365/185.19

FOREIGN PATENT DOCUMENTS 2-142000   5/1990   Japan .

OTHER PUBLICATIONS

Koichi Seki et al; Non–Volatile and Fast Static Memories; An 80ns 1Mb Flash Memory with On–Chip Erase/Erase–Verify Controller; ISSCC 1990 Digest of Technical Papers, pp. 60–61.

Primary Examiner—Vu A. Le
Attorney, Agent, or Firm—Banner & Witcoff, Ltd.

[57] ABSTRACT

A semiconductor memory device comprises a memory cell array comprising a plurality of nonvolatile memory cells each having a two-layer gate structure in which a floating gate and a control gate are stacked, and an auto-program/auto-erase control circuit for designating, on the basis of an erase command input, the plurality of memory cells in the memory cell array, in which data is to be erased, and automatically controlling a process, wherein the auto-program/auto-erase control circuit performs a program verify operation of a pre-program operation, repeats program and program verify operations until the program operation is completed, if the pre-program operation is necessary as a result of the program verify operation, performs erase verify operation at a time the pre-program operation is completed, and then repeats erase and erase verify operations until the erase operation is completed.

23 Claims, 8 Drawing Sheets

SEMICONDUCTOR MEMORY DEVICE

BACKGROUND OF THE INVENTION

The present invention relates to a nonvolatile semiconductor memory device (EEPROM) which is electrically erasable programmable, and more particularly to an EEPROM having at least one of auto-program and auto-erase functions, which is used as a batch-erase type semiconductor memory such as a NOR-type flash EEPROM.

The EEPROM is advantageous in that data in nonvolatile memory cells is not lost even if power is turned off, and a demand for EEPROMs has recently increased remarkably. In particular, a batch-erasable flash memory in which each memory cell is formed of one transistor is expected to be substituted for a large-capacity magnetic disk.

Memory cells used in a cell array of a conventional EEPROM are formed of NMOS-type field-effect transistors (cell transistors) each having a two-layer gate structure in which a floating gate, which is formed in a gate insulating film as a charge storage layer, and a control gate are stacked.

In this type of cell transistor, program characteristics or erase characteristics are deteriorated due to repeated program/erase operation at the time of use. Consequently, compared to the earliest time of use of the device, a program/erasing time increases and the amount of injection/release of electric charge in/from the floating gate decreases. As a result, the range of variation between the threshold voltage in the programmed state of the memory cell and the threshold voltage in the erased state thereof decreases.

In addition, with repetition of program/erase operations at the time of use, an electric field concentrates at the carriers trapped in the insulating film and insulation breakdown of the memory cell will take place. In such a case, it would be impossible to program/erase data in another cell which shares the control gate or source/drain region with the broken cell, or data would be erroneously read out from the memory cell.

For example, if a high program voltage is applied to the control gate shared by the broken cell, a leak current flows from the control gate to the semiconductor substrate through the insulating film of the broken cell. Consequently, problems such that the potential of the program voltage becomes lower than a predetermined level, the program operation is disabled or the power consumption increases, or the like, are occurred.

In the EEPROM, a program voltage and an erase voltage are produced by a high voltage generating circuit which boosts a power supply voltage Vcc to obtain a high voltage. The high voltage generating circuit is constituted by a booster circuit, which comprises a charge pump circuits cascade-connected in multi-stages, and a voltage limiting circuit connected to the final-stage charge pump circuit in the booster circuit.

In the above-described EEPROM, when data is to be programmed, the greater the number of times of applications of program pulses having a constant voltage and a constant pulse width, the greater the amount of charge programmed into the floating gate electrode. In this case, in an intelligent program method adopted to prevent overprogram, data program is effected little by little in a plurality of operations by controlling the number of times of applications of program pulses. A data program operation and a data read operation following the data program operation are repeated, and the program operation is completed when the read data has become equal to the programmed data.

On the other hand, in the field of semiconductor memories including latest large-capacity EEPROMs, provision of a redundancy circuit is essential in order to increase the manufacturing yield. According to the redundancy technique, in addition to an ordinary memory cell array (regular memory cell array), a redundancy memory cell array for relieving, e.g. a defect of the regular memory cell array, and a redundancy address decoder (programmable decoder) for selecting rows of the redundancy memory cell array are provided on the same semiconductor chip. Thus, a defective memory cell of the regular memory cell array, which is found in a test step of the manufacture, is relieved.

As regards latest flash EEPROMs, there is an increasing demand for products adopting a single power supply system wherein no special external power supply is provided for data program/erase. In such flash EEPROMs, when data is to be reprogrammed, it is necessary to generate a voltage higher than a read power voltage Vcc by using a booster circuit built in the memory. If the booster circuit is provided with a current supply capacity necessary for erasing data in all memory cells at a time, the power consumption of the booster circuit would greatly increase. This is disadvantageous for products requiring low power consumption.

In order to suppress an increase in power consumption of the booster circuit, there is an idea that a cell array region, from which data is to be erased, is divided into blocks and the data in the blocks is serially and automatically erased for each block.

However, the conventional flash EEPROM with automatic program/erasing functions is not satisfactory in terms of exactness of control of the threshold voltage of the memory cell, performance and reliability.

BRIEF SUMMARY OF THE INVENTION

The object of the present invention is to provide a semiconductor memory device capable of exactly controlling a threshold voltage of the memory cell in auto-program and auto-erase operations in a flash EEPROM, with the performance and reliability enhanced.

A semiconductor memory device according to the first aspect of the present invention comprises: a memory cell array comprising a plurality of nonvolatile memory cells each having a two-layer gate structure in which a floating gate and a control gate are stacked; and an auto-program control circuit for designating, on the basis of a program command input, one or more of the plurality of memory cells in the memory cell array, in which data is to be programmed and automatically controlling a program process, wherein the auto-program control circuit performs a program verify operation at a time of start of an auto-program operation, subsequently repeats program and program verify operations until the program operation is completed, with respect to a memory cell which is determined to require programming as a result of the program verify operation. Where, the auto-program control circuit controls an injection charge amount into the floating gate in accordance with the number of repetition times of the program and program verify operations. The injection charge amount is controlled by controlling a pulse width of a program pulse.

A semiconductor memory device according to the second aspect of the present invention comprises: a memory cell array comprising a plurality of nonvolatile memory cells each having a two-layer gate structure in which a floating gate and a control gate are stacked; and an auto-erase control circuit for designating, on the basis of a erase command input, the plurality of memory cells in the memory cell array, in which data is to be erased and automatically controlling a erase process, wherein the auto-erase control circuit performs a erase verify operation at a time of start of an auto-erase operation, subsequently repeats erase and erase verify operations until the erase operation is completed, with respect to a memory cell which is determined to require erasing as a result of the erase verify operation. Preferred manners according to the second aspect are as follows.

(1) The auto-erase control circuit further performs detection of an over-erased memory cell for each bitline after the erase operation and a control of a threshold voltage of the over-erased memory cell.

(2) In the erase and erase verify operations, an erase voltage with a predetermined pulse width is applied to perform the erase verify operation in each erase operation as to whether threshold voltages of the memory cells are a predetermined voltage or less, and the erase and erase verify operations are repeated until it is confirmed that threshold voltages of all the memory cells are the predetermined voltage or less.

A semiconductor memory device according to the third aspect of the present invention comprises: a memory cell array comprising a plurality of nonvolatile memory cells each having a two-layer gate structure in which a floating gate and a control gate are stacked; and an auto-program/auto-erase control circuit for designating, on the basis of an erase command input, the plurality of memory cells in the memory cell array, in which data is to be erased, and automatically controlling a process, wherein the auto-program/auto-erase control circuit performs a program verify operation of a pre-program operation, repeats program and program verify operations until the program operation is completed, if the pre-program operation is necessary as a result of the program verify operation, performs erase verify operation at a time the pre-program operation is completed, and then repeats erase and erase verify operations until the erase operation is completed. Preferred manners according to the third aspect are as follows.

(1) The memory cell array includes a plurality of memory cell blocks divided into a row direction. Where, the auto-program/auto-erase circuit serially designates the plurality of memory cell blocks to automatically control a process of the plurality of memory cells in a designated memory cell block.

(2) The auto-program/auto-erase control circuit further performs detection of an over-erased memory cell for each bitline after the erase operation and a control of a threshold voltage of the over-erased memory cell.

(3) In the pre-program operation, a program address is automatically counted up in order to perform the program operation to all the memory cells in the designated memory cell block.

(4) In the pre-program operation, the pre-program operation is also performed to a redundancy cell before defective cell replacement and a main cell after defective cell replacement.

(5) In the erase and erase verify operations, an erase voltage with a predetermined pulse width is applied to perform the erase verify operation in each erase operation as to whether threshold voltages of the memory cells are a predetermined value or less, and the erase and erase verify operations are repeated until it is confirmed that threshold voltages of all the memory cells are the predetermined voltage or less.

(6) The auto-program/auto-erase control circuit performs a leak check which is an over-erased memory cell detection process after confirming the threshold voltages of all the memory cells are the predetermined voltage or less.

(7) The leak check is performed by setting all word lines at 0V, selecting a bitline by an address, and determining whether there is a bitline leak due to the over-erased memory cell in the selected bitline.

(8) An erase sequence is completed if a result of the leak check is "OK", and a self-convergence process, which is a threshold voltage control of the over-erased memory cell, is executed if a result of the leak check is "NG". In this context, "NG" refers to a case where the bitline includes an over-erased memory cell. Where, in the self-convergence process, the threshold voltage of the over-erased memory cell is raised to a predetermined voltage or more by applying a self-convergence voltage to the selected bitline with all word lines kept at 0V.

(9) The auto-program/auto-erase control circuit performs the leak check once again after the self-convergence process, and determines whether the self-convergence has normally been carried out.

(10) The auto-program/auto-erase control circuit executes the erase verify operation once again after the self-convergence process was performed, and confirms whether the threshold voltages of all the memory cells are the predetermined voltage or less.

(11) The auto-program/auto-erase control circuit finishes the erase sequence if it has been confirmed in the erase verify operation after the self-convergence process that the threshold voltages of all the memory cells are the predetermined voltage or less, and performs the erase operation once again if it has been confirmed that part of the memory cells are not the predetermined voltage or less, so that the self-convergence process and the erase operation are repeated until both the leak check and the erase verify operation are determined to be "OK".

As has been described above, according to the semiconductor memory device of the present invention, the threshold voltage of the memory cell can be exactly controlled in the auto-program and auto-erase operations in the flash EEPROM, with the performance and reliability enhanced.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

An embodiment of the present invention will now be described with reference to the accompanying drawings.

A flash EEPROM according to the embodiment has the following basic structures:

(1) having a single power supply system including a booster circuit for boosting a voltage supplied from an external power supply to generate a program/erase voltage, (2) having an automatic program function for designating a plurality of memory cells of a cell array region for data program, and automatically program data, and an automatic erase function for serially designating a plurality of blocks of the cell array region for data erase, for each block, and automatically erasing data in the blocks, and (3) having a defective cell relief control function for relieving, e.g. a defective row of the cell array by replacing it with a redundancy row.

Figure 1:
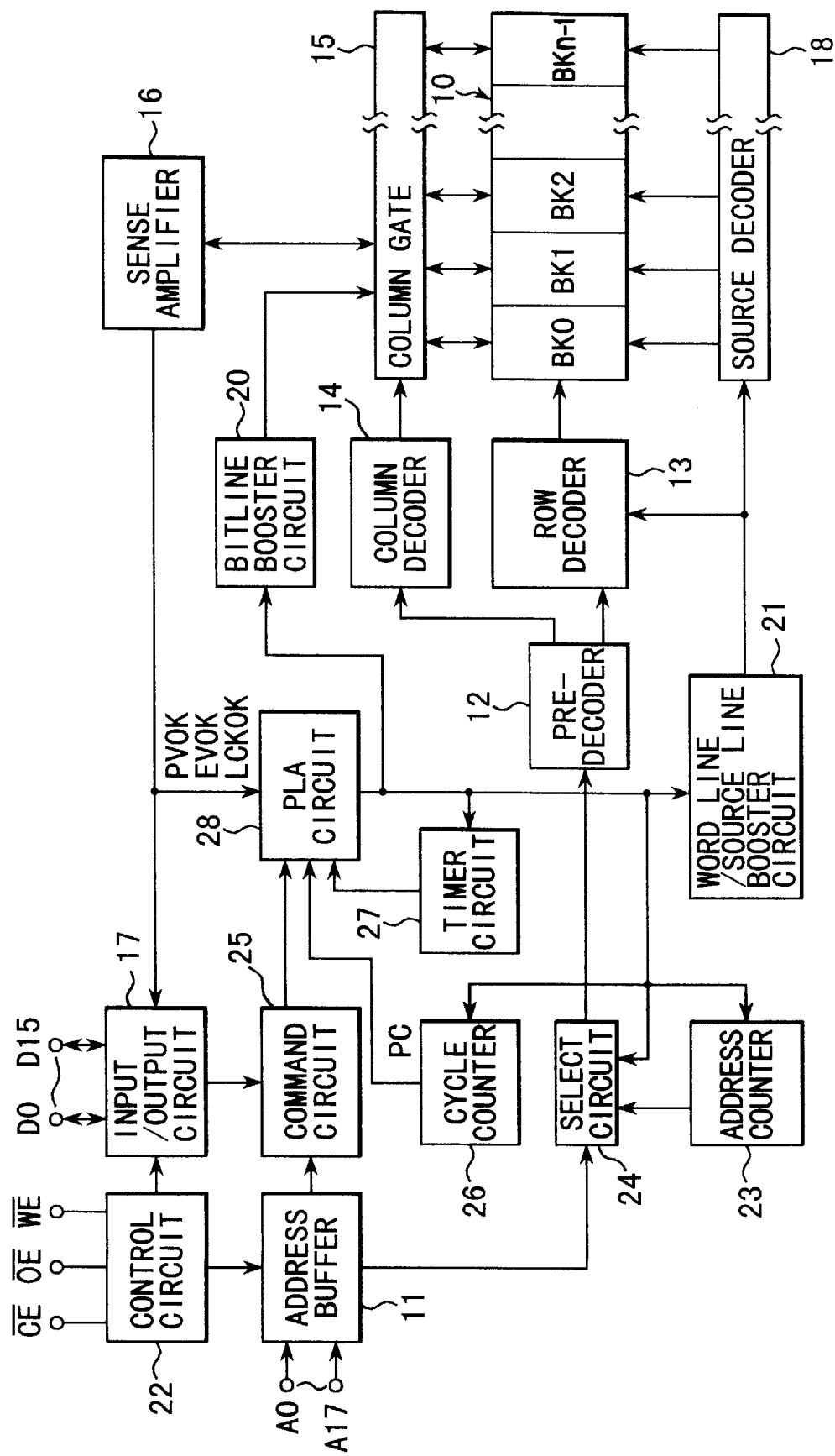
FIG. 1 is a block circuit diagram schematically showing the entire structure of a NOR-type flash EEPROM according to an embodiment of the present invention.

FIG. 1 is a block circuit diagram schematically showing the entire structure of the NOR-type flash EEPROM according to the embodiment of the invention.

In FIG. 1, a memory cell array 10 comprises memory cells (cell transistors) each constituted by an N-channel MOSFET having a floating gate and a control gate. The memory cells constitute, for example, NOR-type memory cell units (see FIG. 2) which are arranged in a matrix as a whole. The memory cell array 10 is divided into an n-number of blocks BK0 to BKn-1 in a row direction.

Figure 2:
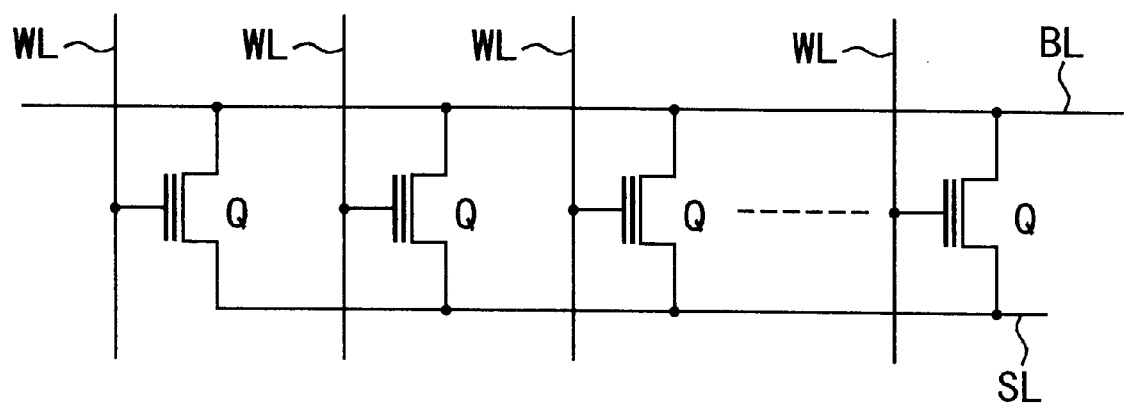
FIG. 2 is a circuit diagram showing part of a NOR-type cell unit of a memory cell array shown in FIG. 1.

In the NOR-type cells shown in FIG. 2, the drains of cell transistors Q are commonly connected to one bitline BL. Word lines WL are connected in association with the respective control gates of cell transistors Q. The each of the sources of cell transistors Q are commonly connected to one source line SL for each block.

Since the operating principle of the cell transistors Q and NOR-type cells is well known, a description thereof is omitted.

For example, 18-bit address signals A0 to A17 are input from outside to an address buffer 11 via address input terminals. A pre-decoder 12 decodes address signals (internal address signals) from the address buffer 11.

A row decoder 13 has a word line driver for decoding a row address signal from the pre-decoder 12, selecting a row of the memory cell array 10, and supplying a predetermined voltage to a word line in accordance with a decoded output.

A column decoder 14 decodes a column address signal from the pre-decoder 12. A column gate 15 is controlled by a decoded output from the column decoder 14 to select a column of the memory cell array 10.

A sense amplifier 16 is connected to the column gate 15. The sense amplifier 16 has functions of sense-amplifying and outputting read-out information from the memory cells and outputting flag signals (program verify determination result flag PVOK, erase verify determination result flag EVOK, and leak check determination result flag LCKOK) in accordance with various operation modes of the EEPROM.

An input/output circuit (I/O buffer) 17 is connected to the sense amplifier 16 and inputs/outputs, e.g. 16-bit input/output data D0 to D15 between input and output terminals. A source decoder 18 has a source line driver for selecting source lines of the blocks BK0 to BKn-1 and supplying a predetermined voltage to the source lines in accordance with a decoded output.

A bitline booster circuit 20 supplies a high voltage necessary for program operation to the bitline via the column gate 15. A word line/source line booster circuit 21 supplies a high voltage necessary for program/erase operations to the word line driver in the row decoder 13 and the source line driver in the source decoder 18 so that the high voltage may be applied to the word line and source line.

A control circuit 22 controls operations of the respective parts of the EEPROM. The control circuit 22 is connected to a chip enable (/CE) input terminal, an output enable (/OE) input terminal, and a write enable (/WE) input terminal.

An address counter 23 for generating address signals generates address signals (row address Ax, column address Ay) for designating addresses of target blocks and memory cells for automatic program/erase.

A select circuit 24 selects, in a normal operation mode, an address signal from the address buffer 11 and supplies it to the pre-decoder 12. In an automatic program/erase mode, the select circuit 24 selects an address signal output from the address counter 23 and supplies it to the pre-decoder 12.

A command circuit 25 decodes command signals, which are combinations of address signals from the address buffer 11 and input signals from the input/output circuit 17, and outputs various control signals.

A cycle counter 26 counts the number of program/erase operations performed for the memory cell array 10. Reference numeral 27 denotes a timer circuit.

A PLA (programmable logic array) circuit 28 achieves the above-described automatic program function and automatic erase function, and controls sequence operations as described below.

The PLA 28 is supplied with outputs from the command circuit 25, a cycle counter 26 and a timer circuit 27 and with various flag signals (PVOK, EVOK, LCKOK) from the sense amplifier 16, and delivers PLA code signals to the bitline booster circuit 20, the word line/source line booster circuit 21, the address counter 23, the cycle counter 26 and the timer circuit 27.

As has been described above, the memory cell array 10 is provided with a redundancy circuit in order to relieve a defective cell found in a checking step in the manufacture of the EEPROM, thereby to increase the manufacturing yield.

In addition, when the data program characteristic or data erase characteristics in memory cells of a main memory cell array is deteriorated during the use of the EEPROM, a function, where necessary, for automatically replacing the memory cells having such deteriorated program/erase characteristics with redundancy memory cells may be provided.

Although not shown, the redundancy circuit includes redundancy memory cells (redundancy cells) for several rows, and a redundancy row decoder. In addition, when the data program characteristic or data erase characteristics in memory cells of a main memory cell array is deteriorated during the use of the EEPROM, a characteristic-deteriorated cell detection circuit and a replacement control circuit, where necessary, for automatically replacing the memory cells having such deteriorated program/erase characteristics with redundancy memory cells may be provided.

Figure 3:
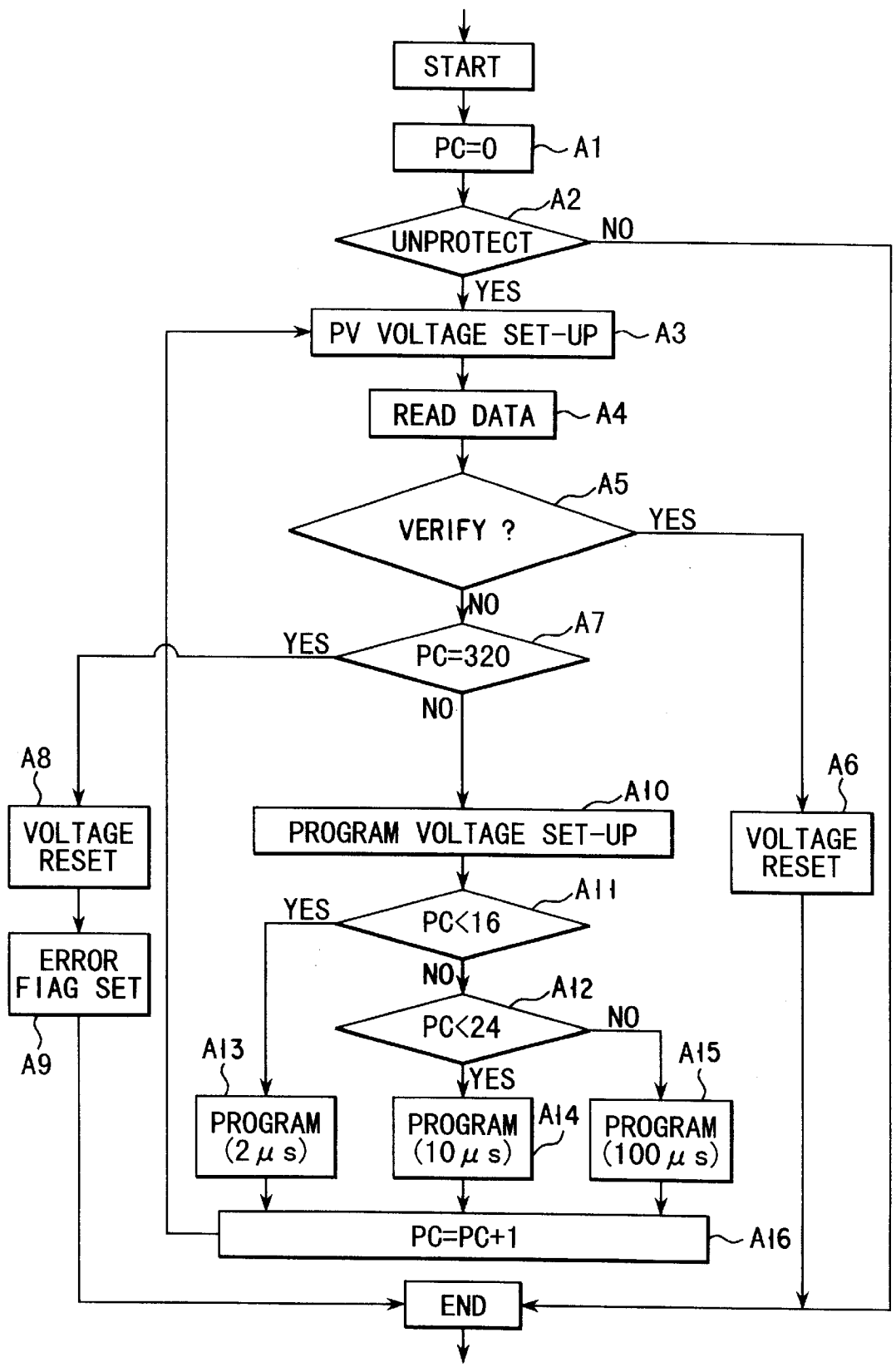
FIG. 3 is a flow chart showing an example of a routine of an automatic program sequence in the flash EEPROM shown in FIG. 1.

FIG. 3 is a flow chart showing an example of a routine of an automatic program sequence by the control of the PLA 28 shown in FIG. 1. The automatic program sequence in the flash EEPROM of this embodiment is characterized in that the sequence is executed from the program verify. Normally, (1) program and (2) program verify are performed until the end of program. In the present invention, however, program verify is first performed and then program and program verify are repeated.

In the program operation in the flow chart ("Start"=start of sequence, "End"=end of sequence) of FIG. 3, a program command is recognized and then a set value PC of the cycle counter is reset (PC=0) (step A1). Then, it is determined whether the designated address is set in the program/erase forbidden state (step A2). In the forbidden state (Unprotect= NO), the sequence is ended. If not in the forbidden state (Unprotect=YES), the sequence is started from program verify (steps A3 to step A5).

The program verify operation, which is first executed, is as follows. At first, program verify voltage (Program Verify Voltage: PV voltage) is set up (step A3), and a read operation (READ) of 500 ns is performed (step A4). It is verified whether read-out data (READ-DATA) is equal to program input data (INPUT-DATA) (step A5). If the read-out data is equal to program input data, there is no need to effect program. Thus, the program verify voltage is reset (step A6) and the sequence is completed. If NO in step A5, a normal program operation is performed.

The basic routine of the program operation is the same as that in the prior art. Specifically, a series of control operations for determining whether data program is normally carried out are performed by program data in a memory cell and reading out the data from the memory cell. These control operations are repeated, where necessary, until the program operation is completed.

In the embodiment of FIG. 3, the number of repeated operations of program and program verify is counted up (PC=PC+1) by the program number counter PC (step A16). In the present embodiment, a maximum number of repeated operations is set at 320 (step A7). If the number of repeated operations exceeds 320, it is determined that the memory cell has a defect and a program voltage is reset (step A8) and an error flag is set (step A9). Thus, the sequence is ended. If the number of repeated operations has not reached the maximum number, the program and program verify are repeated (steps A10 to step A15). In this case, the pulse width of program pulse is varied in accordance with the number of repeated program operations (step A11, step A12). For example, the pulse width of program pulse is 2 $\mu$s from the first to 15th operations (PC<16) (step A13), 10 $\mu$s from the 16th to 23rd operations (16≦PC<24) (step A14), and 100 $\mu$s from the 24th to 320th operations (PC≧24) (step A15).

Figure 4:
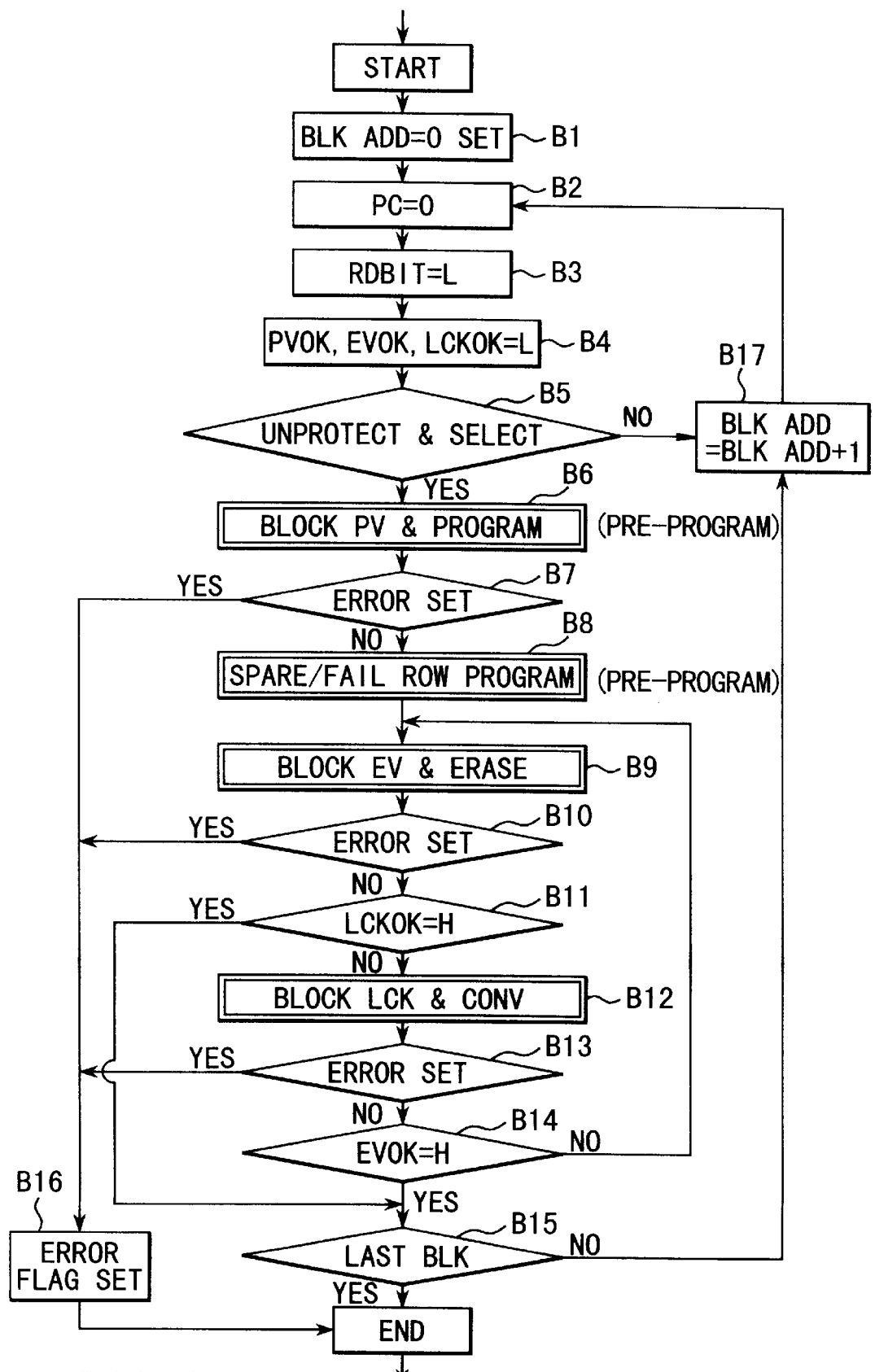
FIG. 4 is a flow chart showing an example of a main routine of an automatic erase sequence in the flash EEPROM shown in FIG. 1.

FIG. 4 is a flow chart showing an example of a main routine of the automatic erase sequence by the control of the PLA 28 shown in FIG. 1.

FIGS. 5 to 8 show details of steps B6, B8, B9 and B12 of FIG. 4. In the automatic erase sequence, like the automatic program sequence, the program verify and erase verify are performed prior to program and erase operations and unnecessary program and erase are omitted.

Figure 5:
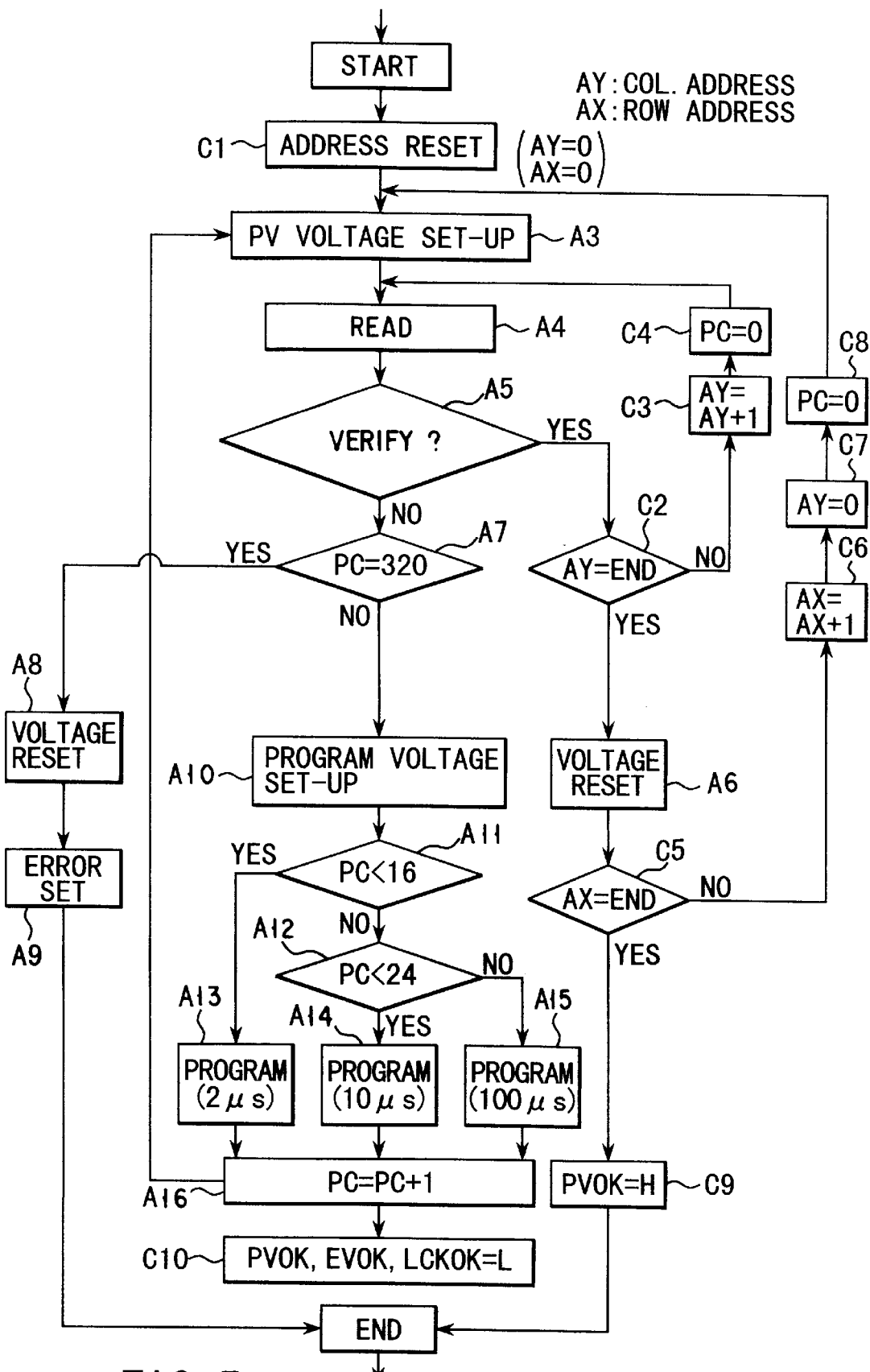
FIG. 5 is a flow chart showing an example of a routine of a pre-program operation on a main memory cell, which corresponds to sub-routine 1 in FIG. 4.
Figure 6:
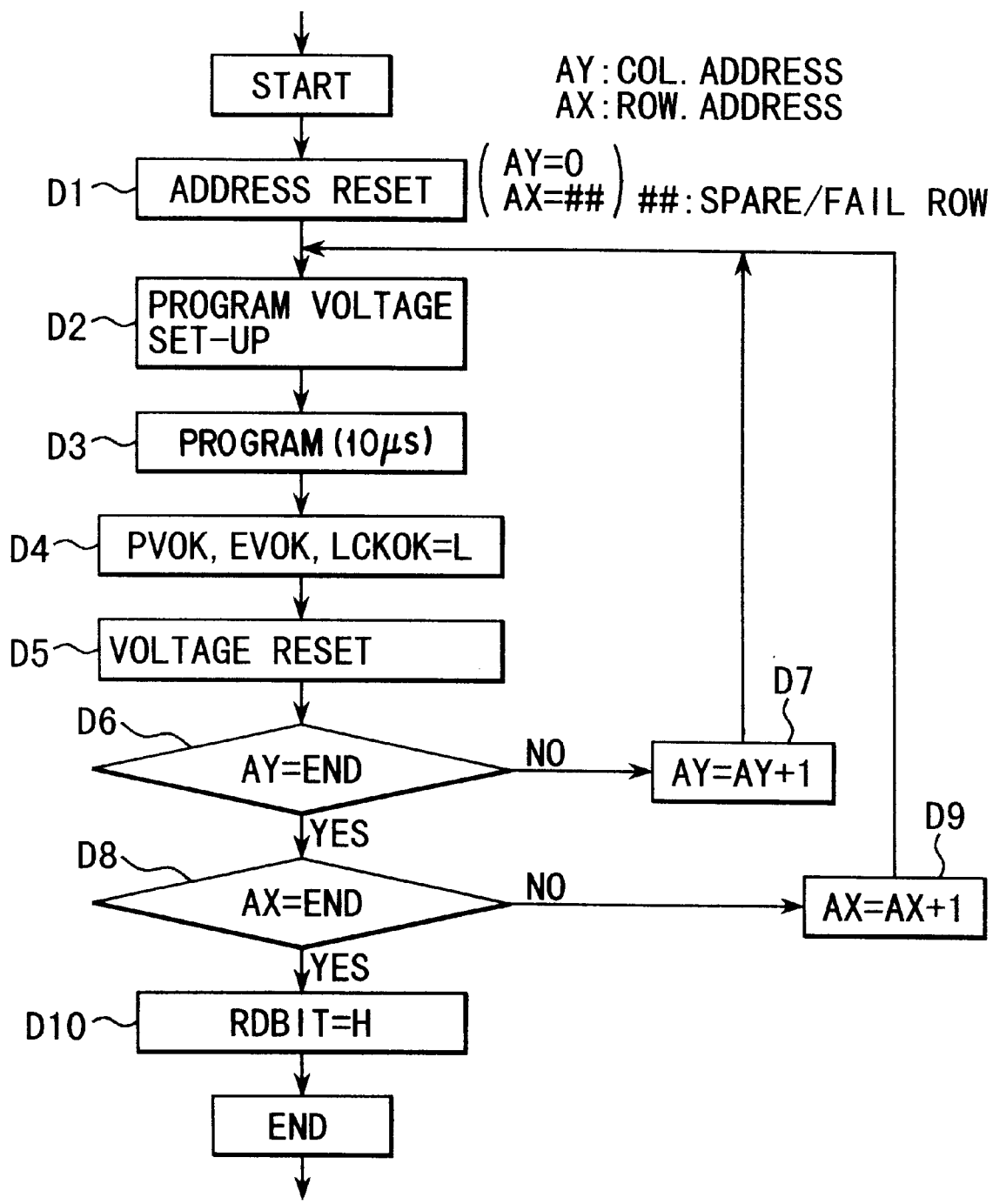
FIG. 6 is a flow chart showing an example of a routine of the pre-program operation on a redundancy cell and a defect-replacement main memory cell, which corresponds to sub-routine 2 in FIG. 4.
Figure 7:
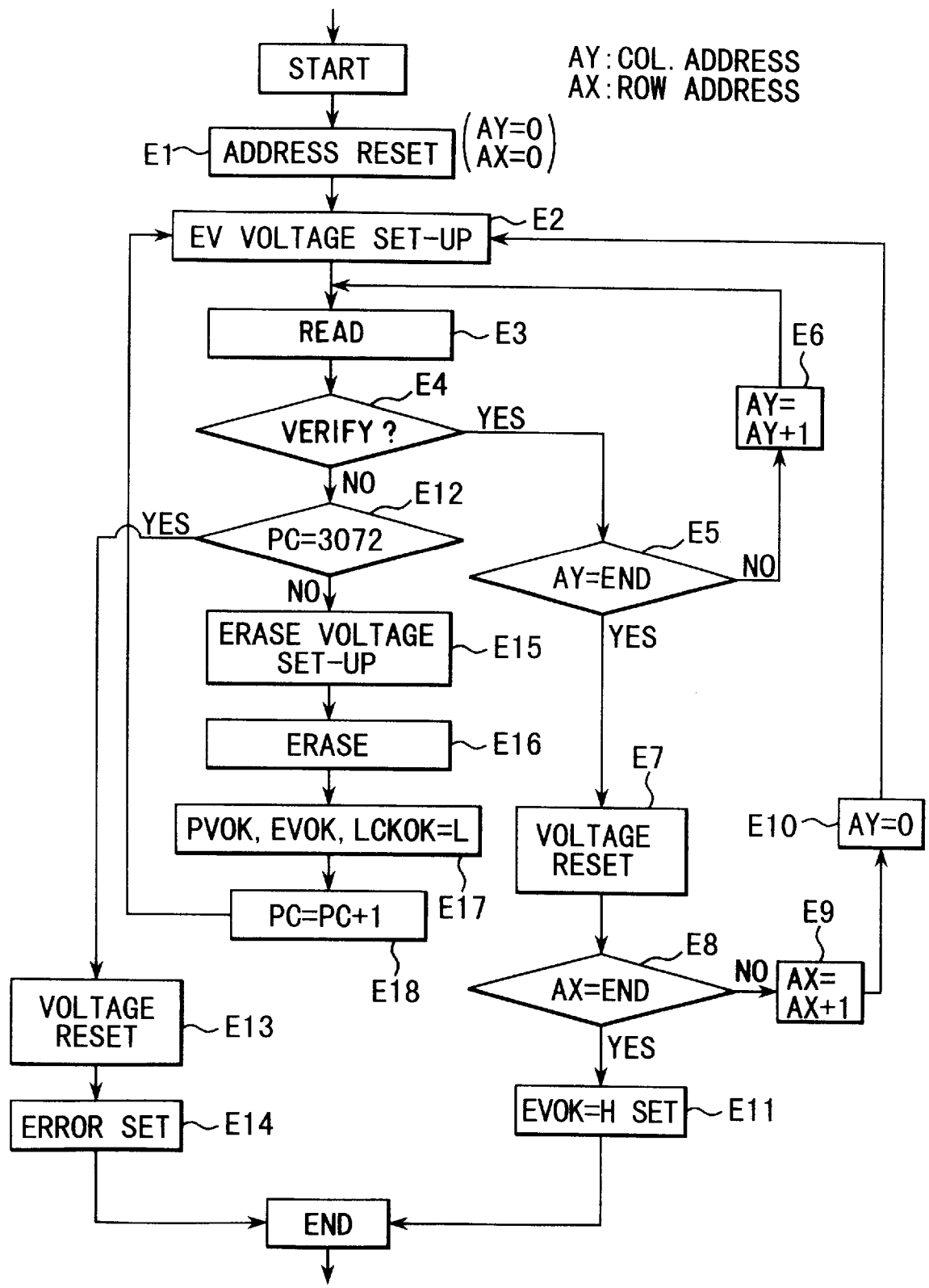
FIG. 7 is a flow chart showing an example of a routine of erase/erase verify operations, which corresponds to sub-routine 3 in FIG. 4.
Figure 8:
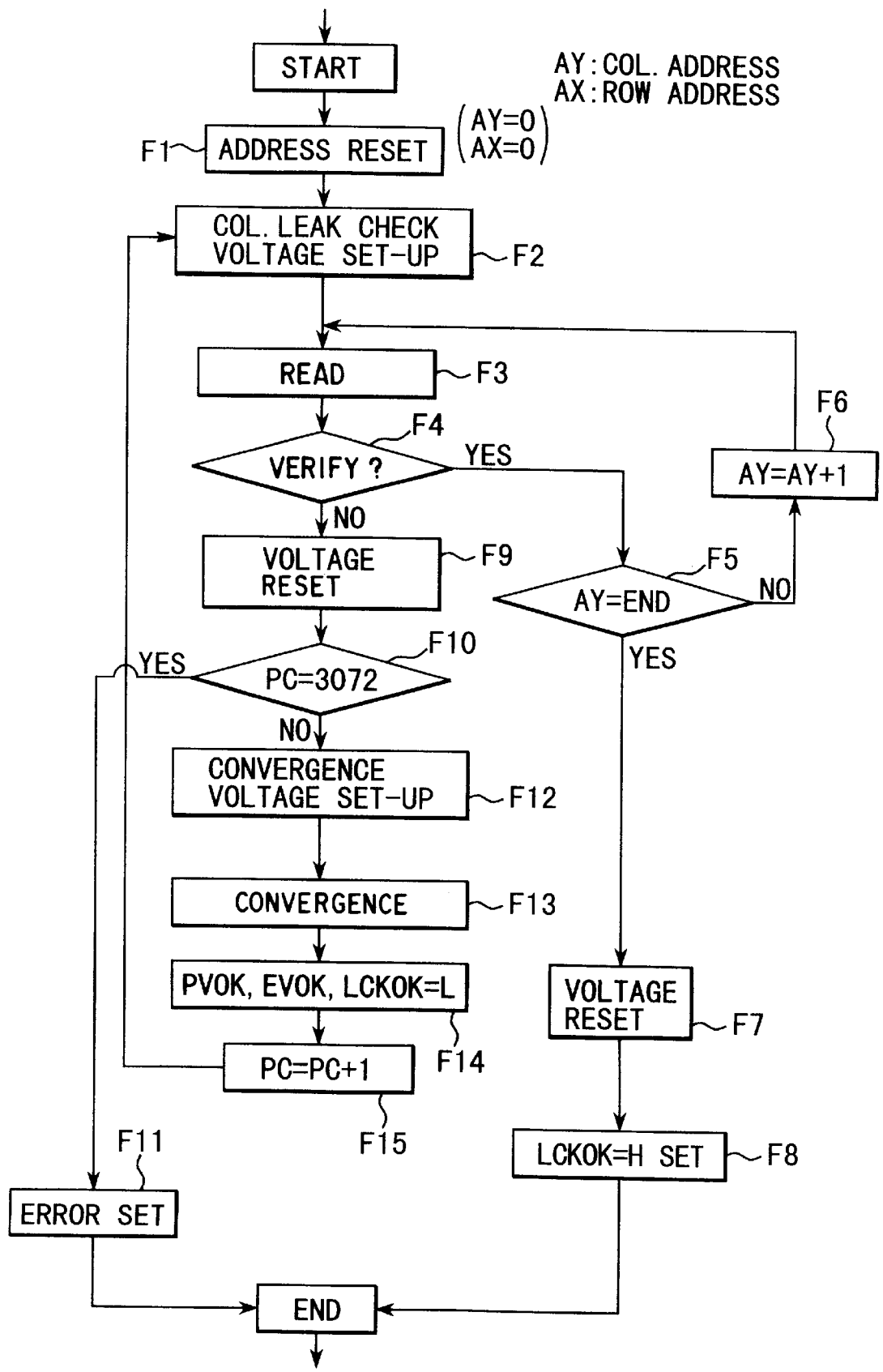
FIG. 8 is a flow chart showing an example of a routine of leak check/self-convergence operations, which corresponds to sub-routine 4 in FIG. 4.

FIG. 5 shows an example of a routine of the pre-program operation to the main cell. FIG. 6 shows an example of a routine of the pre-program operations to the redundancy cell before replacement of a defective cell, and to the main cell after replacement of the defective cell. FIG. 7 shows an example of the routine of the erase and erase verify operations, and FIG. 8 shows an example of the routine of leak check and self-convergence operations.

The operations of the present embodiment illustrated in the flow charts of FIGS. 4 to 8 will now be described.

As is understood from the flow chart of the entire erase operation shown in FIG. 4, after an erase command is recognized, the block select address counter BLK Add is set at 0 (step B1), and the cycle counter PC is set at 0 (step B2). The pre-program confirmation flag RDBIT of the redundancy cell before defective cell replacement and the main cell after defective cell replacement is reset at "L" level (RDBIT=L) (step B3). Then, the program verify determination result flag PVOK, erase verify determination result flag EVOK and leak check determination result flag LCKOK are reset (PVOK, EVOK, LCKOK=L) (step B4).

It is determined whether the designated address is set at the program/erase forbidden state for each block (step B5). If not in the forbidden state, the erase operation is started from the pre-program operation (step B6). In this case, the block select address (BLK Add) is counted up (BLK Add= BLK Add+1) by the counter (step B17) and the erase operations are performed successively from BLK Add=0 (block BK0) to 1 (block BK1), 2 (block BK2), ..., 10 (block BK10).

In the routine of the erase operation, it is determined, if necessary, whether LCKOK is set at "H" level (LCKOK=H) (step B11) and whether EVOK is set at "H" level (EVOK= H) (step B14).

In the block-unit pre-program (Block PV & Program; Pre-Program) operation (step B6) on the main cell in the flow chart of FIG. 4, as is understood from the flow chart shown in FIG. 5, after column address Ay and row address Ax are reset (step C1), count-up (AY=AY+1) of column address Ay (step C3) and count-up (AX=AX+1) of row address Ax (step C6) are added to the program sequence. A block to be erased is selected, and program operations are repeated on main cells of all addresses. In this case, following the end of the column select, the word line voltage is reset (step A6) and is set at read voltage Vcc before shifting to row select. The other operations are the same as the program operations shown in FIG. 3, and thus a description thereof is omitted, with the same reference numerals used.

FIG. 6 illustrates the operation of the pre-program operation (Spare/Fail Row Program) to the redundancy cell before defective cell replacement and to the main cell after defective cell replacement in the flow chart of FIG. 4. When the redundancy cell is not substituted, the redundancy redundancy cell is selected. When the redundancy cell is substituted, the main cell before replacement is selected (step D1). The program pulse with pulse width of 10 $\mu$s is used to perform a program operation (step D2, step D3), and program verify is not performed (step D4 to step D10). The reason why the program verify is not performed is that the result of program verify would become NG when the program defect cell was replaced.

The redundancy column address AY and redundancy row address AX are addresses stored in the defective address memory circuit of the redundancy circuit.

FIG. 7 shows the block erase verify (Block EV) and block erase operations in the flow chart of FIG. 4. The operations are started from the erase verify operation (steps E1 to E4), and the erase operation is performed until the threshold voltage of the memory cell Vth reaches a predetermined voltage (e.g., 3V or less) (steps E2 to E18). Specifically, the cell array region to be erased is divided into blocks, and the erase and erase verify processes are repeated for all addresses for each block to be erased. Thereby, the blocks to be erased are automatically and serially erased for each block.

FIG. 8 shows the block leak check and self-convergence (Block LCK & Conv) operations in the flow chart of FIG. 4. The self-convergence is performed for each bitline (i.e. for each column) (step F1, step F2). In this case, if a read-out result of the sense amplifier using the leak check load transistor (step F3) indicates the absence of bitline leak (e.g. leak current value being 5 μA or less), that is, the read-out state of the "0" program cell, the leak check result is determined to be "OK" (steps F5 to F8).

Inversely, if there is bitline leak (e.g. leak current value being 5 μA or more), that is, in the read-out state of the "1" program cell, the leak check result is determined to be "NG". If the leak check result is "NG", the threshold voltage of the over-erased memory cell which is the cause of the bitline leak is raised by the self-convergence operation, and the bitline leak is eliminated (steps F9 to F14).

In the self-convergence operations, all word lines are set at 0V and a self-convergence voltage (e.g. 5V) is applied to the selected bitline (step F13), thus creating an equivalent state in which the word line is set at 0V in the normal program operation.

The number of erase and self-convergence operations is counted up by the counter PC (step F15). Unlike the above-described program operation, it is determined whether the total number of erase/self-convergence operations is a maximum value or 3072 (step F10).

As has been described above, the features of the automatic erase sequence of the flash EEPROM are as follows:

(1) The program verify of pre-program is first performed for each block, and then the pre-program and program verify are performed until the program operation is completed. Subsequently, the erase verify and subsequent erase and erase verify are performed. The over-erased memory cell detection for each bitline after erase operation and the control of the threshold voltage of the over-erased memory cell are also performed. When a plurality of blocks are erased, these operations are successively performed for each block.

(2) In the pre-program, in order to program data into all memory cells in the designated block, the program address is automatically counted up.

(3) In the pre-program, the pre-program is performed to the redundancy cell before defective cell replacement and the main cell after defective cell replacement.

(4) In the erase and erase verify operation, an erase voltage having a predetermined pulse width is applied to perform the erase verify operation at each erase operation as to whether the threshold voltage of the memory cell is a predetermined voltage or less. The erase and erase verify operations are repeated until confirming that the threshold voltages of all memory cells in the block are less than the predetermined voltage.

(5) After all memory cells in the block have been subjected to the erase verify operation, the leak check which is the over-erased memory cell detection process is performed. In the leak check, all word lines are set at 0V, and bitline for one address is selected. It is determined whether there is a bitline leak due to over-erased memory cell in the selected bitlines.

(6) If the result of the leak check is "OK", the erase sequence is completed. If the result of the leak check is "NG" (i.e. there being a bitline including an over-erased memory cell), the self-convergence process which is the threshold control of the over-erased memory cell is executed. In the self-convergence process, while all word lines are set at 0V, the self-convergence voltage is applied to the selected bitlines for a predetermined time period, and the threshold voltage of the over-erased memory cell is raised to a predetermined voltage or more.

(7) After the self-convergence process, the leak check is performed once again and it is determined whether the self-convergence process has been normally performed.

(8) Once the self-convergence process has been executed, the erase verify operation is invariably re-executed, and it is confirmed whether the threshold voltages of all memory cells are a predetermined value or less.

(9) In the erase verify operation after the self-convergence process, if it is confirmed that the threshold voltages of all memory cells are the predetermined value or less, the erase sequence is finished. If it is confirmed that the threshold voltages of part of memory cells are the predetermined value or more, the erase operation is performed once again. The self-convergence process and erase operation are repeated until both the leak check and erase verify operation are determined to be "OK".

In the flash EEPROM of the above-described embodiment, data is reprogrammed in the memory cell by the auto-program sequence and auto-erase sequence. Thus, without unnecessarily increasing the program time, the threshold voltage of the memory cell after the program and erase operations can be controlled to a predetermined distribution width. In addition, the verify operation is performed at the beginning of the process, and the program/erase operation in the memory cell which requires no program/erase operation is omitted. Accordingly, the over-program and over-erase are prevented and the threshold control is stabilized.

As regards the cells in which data is programmed to the predetermined threshold voltages, no greater stress is applied and the threshold voltages of memory cells are equalized.

In a case where the over-erased memory cell has occurred after the erase, the self-convergence voltage is applied to only the bitline including the over-erased memory cell. Thus, the threshold voltage of the memory cell can be controlled to a predetermined distribution width without applying unnecessary stress.

Substantially the same operations are performed in the auto-program sequence and auto-erase sequence. The circuit configuration is thus simplified.

Specifically, in the erase sequence, the program operation before the erase operation (i.e., pre-program operation) is required. Since "1" data and "0" data are mixed before erase operation, the following two problems are cased by the pre-program operation in the data mixed condition.

(1) A difference of the threshold voltages Vth of the memory cells between "0" data programmed from "1" data and "0" data programmed from "0" data is occurred. This requires the longer erase time and becomes the cause of the dispersion of the threshold voltage Vth of the memory cell after erase operation.

(2) To program to the memory cell having "0" data causes to degradation of the memory cell.

To prevent above problems, data which is already "0" is not programmed and only "1" is programmed. Specifically, the verify operation is preformed in the beginning of the operation during the pre-program operation, and whether data in the memory cell is "0" data or "1" data is determined, thereafter only "1" data, which is necessary to program, is programmed to complete the levels and the threshold voltages Vth of the memory cells after program operation. Accordingly, the stable performance can be realized.

Furthermore, by employing the sequence which starts verify operation in all modes, the circuit structure can be simplified. The circuit area can be reduced so as to realize the cost down cased by the reduction of the chip size by sharing the logic. The time required to design can be reduced to develop the efficiency of the design by unifying the sequence.

Since the data reprogram can be stably performed, the memory device with high reliability can be provided.

In the EEPROM of the above embodiment, the booster circuit for boosting the power supply voltage and obtaining the high voltages such as program voltage and erase voltage may comprise multi-stage, cascade-connected charge pump circuits and a voltage limit circuit connected to the last-stage charge-pump circuit.

When data is programmed, the higher the program voltage, the shorter the time for data program. However, if the program voltage is too high, over-program occurs at the time of data program.

In order to avoid this problem, the intelligent program method may be adopted. In this method, the program voltage is raised little by little and data program is effected in a plurality of operations. The data program operation and the read operation following the data program are repeated, and the program operation is completed when the read data has become equal to the program data.

In this case, in order to set the program voltage and erase voltage at optimal values, the following control may be performed by providing a voltage adjusting circuit on the output side of the booster circuit.

Specifically, after the data program or erase operation to the memory cell is performed, the data in the memory cell is read out. Thus, a series of controls for testing whether the data program or erase operation is normally performed are carried out. These controls are repeated, where necessary, until the data program or erase operation is normally performed. When the number of execution of the series of controls (i.e. the number of tests) is stored, the number of tests is compared with a predetermined value. In accordance with the comparison result, control data for controlling the voltage setting means is set and the voltage adjusting circuit is automatically controlled to set the output voltage (program voltage or erase voltage) of the booster circuit at an optimal voltage. In addition, the control data is stored in the nonvolatile memory means.

In this case, if the number of tests is greater than the set value, the control is effected to raise the output voltage of the booster means in order to enhance the program or erase performance. If the number of tests is less than the set value, the control is effected to lower the output voltage of the booster means in order to decrease the program or erase performance. Thereby, the automatic adjustment can be performed to set the output voltage of the booster means at an optical value.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor memory device comprises:
   a memory cell array comprising a plurality of nonvolatile memory cells each having a two-layer gate structure in which a floating gate and a control gate are stacked; and
   an auto-program control circuit for designating, on the basis of a program command input, one or more of said plurality of memory cells in said memory cell array, in which data is to be programmed and automatically controlling a program process, wherein
   said auto-program control circuit performs a program verify operation at a time of start of an auto-program operation, subsequently repeats program and program verify operations until the program operation is completed, with respect to a memory cell which is determined to require programming as a result of the program verify operation.

2. The semiconductor memory device according to claim 1, wherein said auto-program control circuit controls an injection charge amount into said floating gate in accordance with the number of repetition times of the program and program verify operations.

3. The semiconductor memory device according to claim 2, wherein said injection charge amount is controlled by controlling a pulse width of a program pulse.

4. A semiconductor memory device comprises:
   a memory cell array comprising a plurality of nonvolatile memory cells each having a two-layer gate structure in which a floating gate and a control gate are stacked; and
   an auto-erase control circuit for designating, on the basis of a erase command input, said plurality of memory cells in said memory cell array, in which data is to be erased and automatically controlling a erase process, wherein
   said auto-erase control circuit performs a erase verify operation at a time of start of an auto-erase operation, subsequently repeats erase and erase verify operations until the erase operation is completed, with respect to a memory cell which is determined to require erasing as a result of the erase verify operation.

5. The semiconductor memory device according to claim 4, wherein said auto-erase control circuit further performs detection of an over-erased memory cell for each bitline after the erase operation and a control of a threshold voltage of the over-erased memory cell.

6. The semiconductor memory device according to claim 4, wherein, in the erase and erase verify operations, an erase voltage with a predetermined pulse width is applied to perform the erase verify operation in each erase operation as to whether threshold voltages of the memory cells are a predetermined voltage or less, and the erase and erase verify operations are repeated until it is confirmed that threshold voltages of all the memory cells are the predetermined voltage or less.

7. A semiconductor memory device comprises:
   a memory cell array comprising a plurality of nonvolatile memory cells each having a two-layer gate structure in which a floating gate and a control gate are stacked; and an auto-program/auto-erase control circuit for designating, on the basis of an erase command input, said plurality of memory cells in said memory cell array, in which data is to be erased, and automatically controlling a process, wherein said auto-program/auto-erase control circuit performs a program verify operation of a pre-program operation, repeats program and program verify operations until the program operation is completed, if the pre-program operation is necessary as a result of the program verify operation, performs erase verify operation at a time the pre-program operation is completed, and then repeats erase and erase verify operations until the erase operation is completed.

8. The semiconductor memory device according to claim 7, wherein said memory cell array includes a plurality of memory cell blocks divided into a row direction.

9. The semiconductor memory device according to claim 8, wherein said auto-program/auto-erase circuit serially designates said plurality of memory cell blocks to automatically control a process of said plurality of memory cells in a designated memory cell block.

10. The semiconductor memory device according to claim 7, wherein said auto-program/auto-erase control circuit further performs detection of an over-erased memory cell for each bitline after the erase operation and a control of a threshold voltage of the over-erased memory cell.

11. The semiconductor memory device according to claim 9, wherein, in the pre-program operation, a program address is automatically counted up in order to perform the program operation to all the memory cells in the designated memory cell block.

12. The semiconductor memory device according to claim 7, wherein, in the pre-program operation, the pre-program operation is also performed to a redundancy cell before defective cell replacement and a main cell after defective cell replacement.

13. The semiconductor memory device according to claim 7, wherein, in the erase and erase verify operations, an erase voltage with a predetermined pulse width is applied to perform the erase verify operation in each erase operation as to whether threshold voltages of the memory cells are a predetermined value or less, and the erase and erase verify operations are repeated until it is confirmed that threshold voltages of all the memory cells are the predetermined voltage or less.

14. The semiconductor memory device according to claim 13, wherein said auto-program/auto-erase control circuit performs a leak check which is an over-erased memory cell detection process after confirming the threshold voltages of all the memory cells are the predetermined voltage or less.

15. The semiconductor memory device according to claim 14, wherein said leak check is performed by setting all word lines at 0V, selecting a bitline by an address, and determining whether there is a bitline leak due to the over-erased memory cell in the selected bitline.

16. The semiconductor memory device according to claim 15, wherein an erase sequence is completed if a result of the leak check is "OK", and a self-convergence process, which is a threshold voltage control of the over-erased memory cell, is executed if a result of the leak check is "NG".

17. The semiconductor memory device according to claim 16, wherein in the self-convergence process, the threshold voltage of the over-erased memory cell is raised to a predetermined voltage or more by applying a self-convergence voltage to the selected bitline with all word lines kept at 0V.

18. The semiconductor memory device according to claim 16, wherein said auto-program/auto-erase control circuit performs the leak check once again after the self-convergence process, and determines whether the self-convergence has normally been carried out.

19. The semiconductor memory device according to claim 16, wherein said auto-program/auto-erase control circuit executes the erase verify operation once again after the self-convergence process was performed, and confirms whether the threshold voltages of all the memory cells are the predetermined voltage or less.

20. The semiconductor memory device according to claim 19, wherein said auto-program/auto-erase control circuit finishes the erase sequence if it has been confirmed in the erase verify operation after the self-convergence process that the threshold voltages of all the memory cells are the predetermined voltage or less, and performs the erase operation once again if it has been confirmed that part of said memory cells are not the predetermined voltage or less, so that the self-convergence process and the erase operation are repeated until both the leak check and the erase verify operation are determined to be "OK".

21. A semiconductor memory device comprising:
a plurality of nonvolatile memory cells each having a charge storage layer; and
an auto-program control circuit for performing a program verify operation at a time of start of an auto-program operation, subsequently repeating program and program verify operations until the program operation is completed, with respect to a memory cell which is determined to require programming as a result of the program verify operation.

22. A semiconductor memory device comprising:
a plurality of nonvolatile memory cells each having a charge storage layer; and
an auto-ease control circuit for performing an erase verify operation at a time of start of an auto-erase operation, subsequently repeating erase and erase verify operations until the erase operation is completed, with respect to a memory cell which is determined to require erasing as a result of the erase verify operation.

23. A semiconductor memory device comprising:
a memory cell array comprising a plurality of nonvolatile memory cells each having a charge storage layer; and
an auto-program/auto-ease control circuit for performing a program verify operation of a pre-program operation, repeating program and program verify operations until the program operation is completed, if the pre-program operation is necessary as a result of the program verify operation, performing erase verify operation at a time the pre-program operation is completed, and then repeating erase and erase verify operations until the erase operation is completed.

* * * * *